(12) United States Patent
Kenington

(10) Patent No.: US 8,421,554 B2
(45) Date of Patent: *Apr. 16, 2013

(54) FILTERING DEVICE FOR FILTERING RF SIGNALS AND METHOD FOR FILTERING RF SIGNALS

(75) Inventor: Peter Kenington, Chepstow (GB)

(73) Assignee: Ubidyne, Inc., Wilmington, DE (US)

( * ) Notice: Subject to any disclaimer, the term of this patent is extended or adjusted under 35 U.S.C. 154(b) by 593 days.

This patent is subject to a terminal disclaimer.

(21) Appl. No.: 12/571,696

(22) Filed: Oct. 1, 2009

(65) Prior Publication Data
US 2011/0081878 A1    Apr. 7, 2011

(51) Int. Cl.
H01P 5/16 (2006.01)
H03H 7/54 (2006.01)
H03H 7/46 (2006.01)
H03H 9/64 (2006.01)
H04B 1/50 (2006.01)
H04B 1/10 (2006.01)

(52) U.S. Cl.
USPC ........... 333/126; 333/129; 333/132; 333/133; 455/78; 455/82; 455/213; 455/307; 370/278; 370/282

(58) Field of Classification Search .................. 333/117, 333/118, 124–129, 132–136, 175, 185–187, 333/189, 193, 194; 455/78, 82, 212, 213, 455/296, 307; 370/201, 278, 282
See application file for complete search history.

(56) References Cited

U.S. PATENT DOCUMENTS

| | | | |
|---|---|---|---|
| 3,587,009 A | | 6/1971 | Kibler |
| 3,988,705 A | * | 10/1976 | Drapac ......................... 333/109 |
| 4,292,607 A | | 9/1981 | Goldie et al. |
| 4,538,123 A | | 8/1985 | Mariani et al. |
| 4,694,266 A | * | 9/1987 | Wright ........................... 333/196 |
| 4,963,945 A | * | 10/1990 | Cooper et al. ................. 455/307 |
| 5,065,453 A | | 11/1991 | Thomas |

(Continued)

FOREIGN PATENT DOCUMENTS

| | | |
|---|---|---|
| EP | 0 273 793 A1 * | 7/1988 |
| JP | 55-67201 | 5/1980 |

(Continued)

OTHER PUBLICATIONS http://en.wikipedia.org/wiki/Duplexer; dated Jul. 28, 2009.

(Continued)

*Primary Examiner* — Barbara Summons
(74) *Attorney, Agent, or Firm* — Stephen H. Eland; Dann, Dorfman, Herrell & Skillman

(57) ABSTRACT

A filtering device comprises an analogue quadrature splitter together with a first filtering element and a second filtering element. The filtering device is adapted to transform filtering characteristics of the first filtering element and filtering characteristics of the second filtering element into an effective filtering characteristic present in an output signal at an output terminal of the analogue quadrature splitter. The first filtering element and the second filtering element comprise filtering elements of high accuracy, with a steep roll-off but poor power handling capabilities. Using a high power quadrature splitter it is possible to transform the filtering characteristics of the first filtering element and/or the second filtering characteristic of the second filtering element into the effective filtering characteristics. The present disclosure further provides a method for filtering RF signals and a computer program implementing the manufacture of the filtering device and an execution of the method of filtering.

19 Claims, 10 Drawing Sheets

U.S. PATENT DOCUMENTS

| | | | |
|---|---|---|---|
| 5,473,295 | A | 12/1995 | Turunen |
| 5,721,521 | A | 2/1998 | Drabeck et al. |
| 5,894,251 | A | 4/1999 | Taguchi et al. |
| 6,201,457 | B1 | 3/2001 | Hickernell |
| 6,374,094 | B1 | 4/2002 | Zappala |
| 6,768,396 | B2 | 7/2004 | Klee et al. |
| 6,934,562 | B1 | 8/2005 | Wilding |
| 7,038,557 | B2 | 5/2006 | Nakamura et al. |
| 7,437,139 | B2 | 10/2008 | Lo et al. |
| 8,013,690 | B2 * | 9/2011 | Miyashiro .................... 333/176 |
| 8,264,298 | B2 * | 9/2012 | Kenington .................... 333/126 |
| 2006/0019611 | A1 | 1/2006 | Mages |
| 2006/0152304 | A1 * | 7/2006 | Liang et al. .................... 333/176 |
| 2009/0231058 | A1 * | 9/2009 | Nishino et al. ................ 333/118 |
| 2009/0289744 | A1 * | 11/2009 | Miyashiro .................... 333/175 |
| 2011/0080229 | A1 * | 4/2011 | Kenington .................... 333/126 |
| 2011/0080856 | A1 * | 4/2011 | Kenington .................... 370/278 |
| 2011/0081878 | A1 | 4/2011 | Kenington |

FOREIGN PATENT DOCUMENTS

| | | | | |
|---|---|---|---|---|
| JP | 63-206029 | * | 8/1988 | .................... 333/167 |
| JP | 9-284075 | | 10/1997 | |
| JP | 2007-208350 | * | 8/2007 | |
| WO | WO 2007/066426 | * | 6/2007 | |

OTHER PUBLICATIONS http://en.wikipedia.org/wiki/Diplexer; dated Jul. 28, 2009.
http://rfsolutions.com/duplex.htm; dated 1996-2005.
Wen et al, Suppression of Reflection Coefficients of Surface Acoustic Wave Filters Using Quadrature Hybrids; IEEE Transactions on Ultrasonics, Ferroelectrics and Frequency Control; ISSN 0885-3010, Oct. 2006, V. 53, No. 10, pp. 1912-1917.
Jachowski, "Passive Enhancement of Resonator Q in Microwave Notch Filters", 2004 IEEE MTT-S Digest, pp. 1315-1318.

* cited by examiner

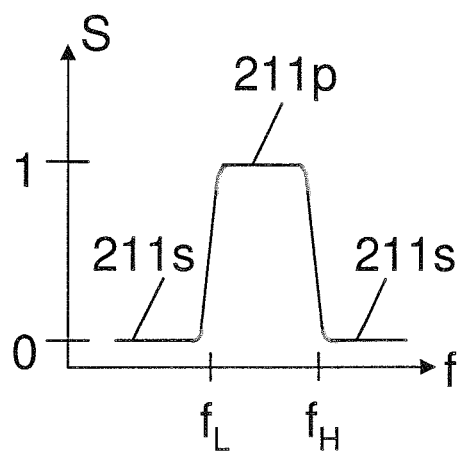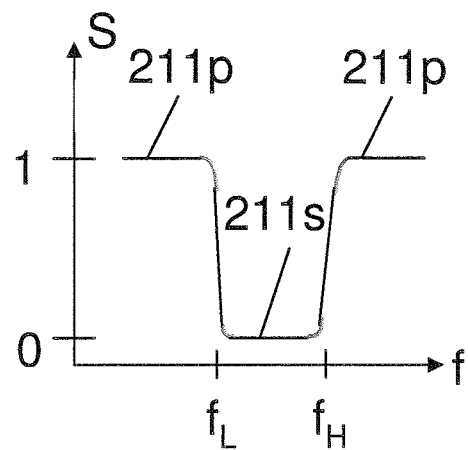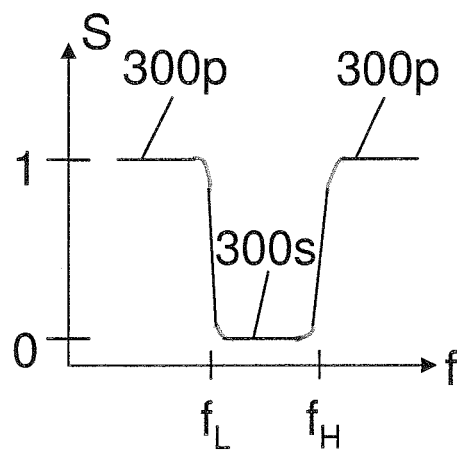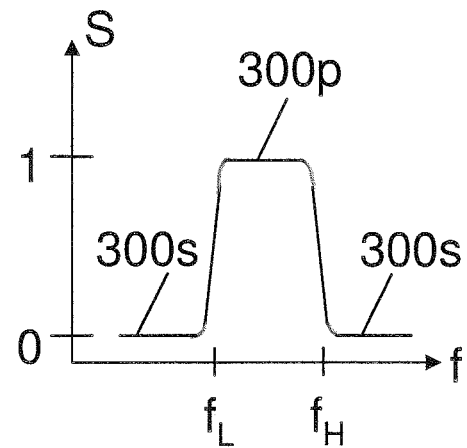
Figure 1d  Figure 1e

FILTERING DEVICE FOR FILTERING RF SIGNALS AND METHOD FOR FILTERING RF SIGNALS

CROSS REFERENCE TO OTHER APPLICATIONS

The present application is related to U.S. patent application Ser. No. 12/571,808 entitled: "Filtering Device and a Method for Filtering a Signal", filed Oct. 1, 2009, and U.S. patent application Ser. No. 12/571,727 entitled: "Duplexer and Method for Separating a Transmit Signal and a Receive Signal", filed Oct. 1, 2009. The entire disclosures of each of the foregoing applications are incorporated herein by reference.

FIELD OF THE INVENTION

The field of the present invention relates to a filtering device for RF signals.

BACKGROUND OF THE INVENTION

There is a need in the field of RF technology to provide a filtering device that is cheap, of high-performance and can withstand high RF power. Such filtering devices are, for example, used in order to prevent out of band emissions of a transmitter and/or a receiver system. State of the art filtering devices of high performance and withstanding high power are expensive and typically quite bulky. As long as only low-power signals need to be filtered, there is a large variety of low-power filtering devices available. There is also a need for assisting an existing (low-power) filter where improved performance is needed immediately adjacent (in frequency terms) to an existing bandpass filter, for example. This can be either because the existing filter does not have the required stop-band attenuation or because its roll-off is insufficient.

Therefore it is of interest to provide a filtering device which combines an accuracy of a low-power filtering device with filtering to filter RF signals at a high-power level. Known high-accuracy filtering devices are, for example, surface acoustic wave filtering devices (SAW). Unfortunately the SAW filtering devices are not capable of handling high-power levels, exceeding several watts. For example, an SAW based duplexer Epcos B7462 is adapted to handle 1 watt of transmit power within a pass band, but only 10 milliwatts of out-of-band power.

The prior art also teaches use of a circulator in order to transform filtering characteristics of a low-power filtering device into transformed filtering characteristics at a high RF power level.

U.S. Pat. No. 5,473,295 to LK-Products OY, Finland teaches a SAW filter being coupled to a receiver (Rx) branch of a duplex filter. The provision of the SAW filter increases the stop band attenuation of the duplex filter. The SAW filter is configured as a notch filter. The SAW filter improves the rejection of a band-pass filter in a mobile radio telephone.

Jiguo Wen, et al. disclose "Suppression of Reflection Coefficients of Surface Acoustic Wave Filters using Quadrature Hybrids", published in Ultrasonics, IEEE transactions on Ferroelectrics and Frequency Control, Volume 53, issue 10, pages 1912-1917. The Wenoto paper describes the use of quadrature hybrids to improve the input and output matching characteristics of a pair of identical SAW filters. The Hashimoto paper uses two quadrature hybrids.

SUMMARY OF THE INVENTION

The present disclosure teaches a filtering device which comprises an analogue quadrature splitter, a first filtering element and a second filtering element. The analogue quadrature splitter splits an input signal into an in phase component and a quadrature component. The first filtering element has a first filtering characteristic comprising at least one first pass band and at least one first stop band. The second filtering element has a second filtering characteristic comprising at least one second pass band and at least one second stop band. The analogue quadrature splitter is adapted to substantially transform at least one of the at least one first pass band or the at least one second pass band into at least one effective stop band. The analogue quadrature splitter is further adapted to substantially transform at least one of the at least one first stop band or the at least one second stop band into at least one effective pass band; yielding an output signal comprising the at least one effective stop band and the at least one effective pass band.

The present disclosure further teaches a cascading of the filtering device. The cascading comprises using more than one of the filtering devices such that an output of one of the more than one filtering devices is forwarded as an input to another one of the cascaded filtering devices.

The present disclosure further teaches a method for filtering. The method for filtering comprises the steps of splitting an input signal into an in phase component and a quadrature component by means of analogue processing. The method further comprises filtering at least one of the in phase component or the quadrature component. The method further comprises a transforming of filtering characteristics, wherein the transformed filtering characteristics yield an output signal. The output signal substantially comprises the transformed filtering characteristics. The method for filtering may be carried out for more than one iteration of the method when filtering signals. The action of splitting an input signal into an in phase component and a quadrature component may be based on using an analogue quadrature splitter.

The transforming of filtering characteristics comprises transforming of the at least one first pass band or the at least one second pass band substantially into at least one effective stop band. The transforming further comprises transforming the at least one first stop band or the at least one second stop band substantially into at least one effective pass band.

It will be appreciated by the person skilled in the art that the transforming of the filtering characteristics may lead to an addition of a ripple on one or more of the transformed pass bands and/or the transformed stop bands. The additional ripple is not shown in the Figures for the sake of clarity. The term "substantially transforming" as used herein should be construed as the transforming with or without the additional ripple on one or more of the transformed pass bands and/or the transformed stop bands.

The present disclosure further discloses a computer program product embedded on a computer readable medium and the computer readable medium comprising executable instructions for the execution of a manufacture of a filtering device. The filtering device comprises an analogue quadrature splitter, a first filtering element and second filtering element. The analogue quadrature splitter splits an input signal into an in phase component and a quadrature component. The first filtering element with a first filtering characteristic comprises at least one first pass band and at least one first stop band. The second filtering element with a second filtering characteristic comprises at least one second pass band and at least one second stop band. The analogue quadrature splitter is adapted to substantially transform at least one of the at least one first pass band or the at least one second pass band into at least one effective stop band. The analogue quadrature splitter is further adapted to substantially transform at least one of the at least one first stop band or the at least one second stop band into at least one effective pass band. The analogue quadrature splitter yields an output signal. The output signal comprises the at least one effective stop band and the at least one effective pass band.

The present disclosure further teaches a computer program product embedded on a computer readable medium comprising executable instructions for the execution of a method of filtering the method comprising a step of splitting an input signal into an in phase component and a quadrature component. The method further comprises filtering at least one of the in phase component or the quadrature component. The method further comprises transforming filtering characteristics. The transformed filtering characteristics yield an output signal substantially comprising the transformed filtering characteristics.

BRIEF DESCRIPTION OF THE DRAWINGS

FIG. 1a shows a filtering device incorporating a circulator.

FIG. 1d shows a transformation of a band pass into an effective band stop.

FIG. 1e shows a transformation of a band stop into an effective band pass.

DETAILED DESCRIPTION OF THE INVENTION

For a better understanding of the present disclosure reference shall now be made to a preferred aspect of the present disclosure, examples of which are illustrated in the accompanying drawings. It will be understood that the embodiments and aspects of the invention described herein are only examples and do not limit the protective scope of the claims in any way. The invention is defined by the claims and their equivalents. It will be also understood that features of one aspect can be combined with features of different aspects.

FIG. 1a shows a filtering device 10a comprising a circulator as is known in the art. RF input signals entering the circulator will be forwarded to a filtering element, for example a band pass filter. The filtering element is capable of handling a low level of RF power. All energy within a pass band of the filtering element will be dumped in a load A. The RF energy within stop bands of the filtering element will be rejected and forwarded by the circulator to the RF output of the circulator. The forwarding by the circulator results in a transformation of the filtering characteristic of the filtering element as will be explained further down. The circulator withstanding high power levels, as used in FIG. 1a, is quite expensive. A power rating of the circulator needs to be carefully matched to the power level of the RF input, in order to ensure that the circulator stays within its range of linear operation. Furthermore circulators are quite bulky. Therefore circulators are a less favourable solution for some applications, such as for example in relaying, i.e. transmitting and receiving units, in which only a limited amount of space available.

Figure 1B:
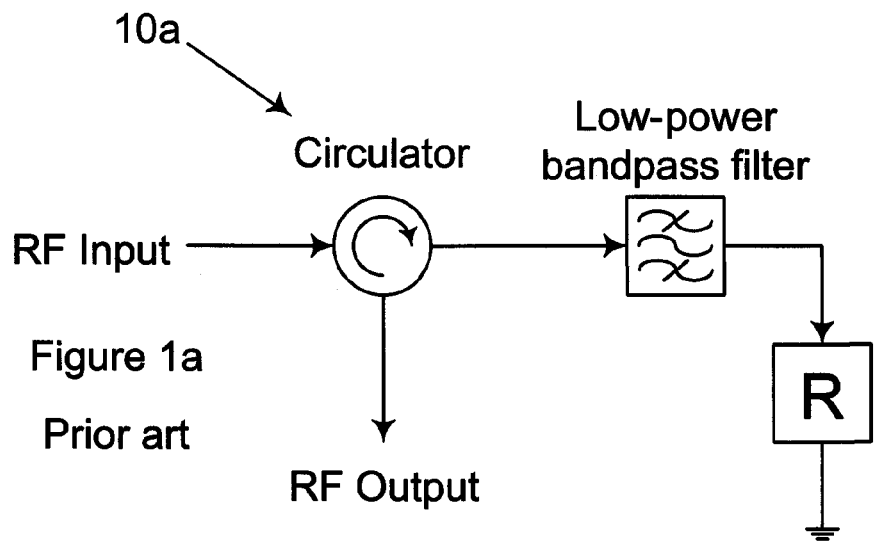
FIG. 1b shows a transfer function S of a low pass filter being transformed into a high pass filter.
Figure 1B:
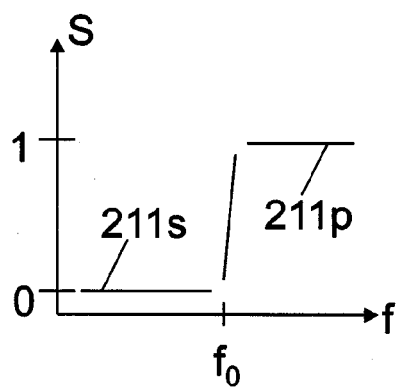

FIG. 1b shows in an upper half a transfer function S of a high-pass filter element (high pass). The high-pass filter element comprises a first stop band 211s below a transition frequency $f_0$ and a first pass band 211p above the transition frequency $f_0$. If the high pass is transformed, in a filtering device 10 of the present disclosure, the first pass band 211p is substantially transformed into a first stop band 300s. The first stop band 211s is substantially transformed into a first pass band 300p, as depicted in the lower half of FIG. 1b. The filtering device 10 of the present disclosure substantially transforms stop bands of the low-power, high-accuracy filter element into pass bands of the high-power, high-accuracy filter element at an output 120 of the filtering device 10 (see FIG. 2). The transforming of the filtering characteristics may include additional ripple in the transformed filtering characteristics. Therefore the transformation as given in the FIGS. 1b-1f shall be construed as schematic only.

Figure 1C:
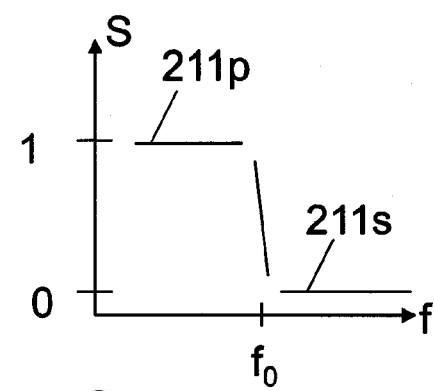
FIG. 1c shows a transformation of a high pass filter into a low pass.

FIG. 1c shows in an upper half a low-pass filtering characteristic comprising a first pass band 211p below a transition frequency $f_0$ and first stop band 211s above the transition frequency $f_0$. When using the low-pass filtering characteristic in combination with the filtering device 10 of the present disclosure, the pass bands will again be substantially transformed into the stop bands and the stop bands will be substantially transformed into the pass bands. The lower half of FIG. 1c displays the transformed filtering characteristic comprising an effective stop band 300s and an effective pass band 300p. It is to be understood that from high-pass filtering elements (FIG. 1b) and a low-pass filtering elements (FIG. 1c) a plurality of further filtering characteristics may be derived. A transformation of the further filtering characteristics may be derived from the transformations of the high-pass filtering elements (lower half of FIG. 1b) and the low-pass filtering elements (lower half of FIG. 1c) Non-limiting examples of the further filtering characteristics are a band pass, a band stop and a notch filter.

FIG. 1d shows a transformation of the band-pass filtering characteristic comprising first stop bands 211s and a first pass band 211p. The band-pass characteristics of the upper half of FIG. 1d are transformed into a band-stop characteristic, as displayed in the lower half of FIG. 1d. The band stop comprises effective pass bands 300p and the effective stop band 300s.

FIG. 1e shows a transformation of a band-stop filtering characteristic, as displayed in the upper half, into a band-pass characteristic, as displayed in the lower half of FIG. 1e when used with the filtering device 10 of the present disclosure.

Figure 2:
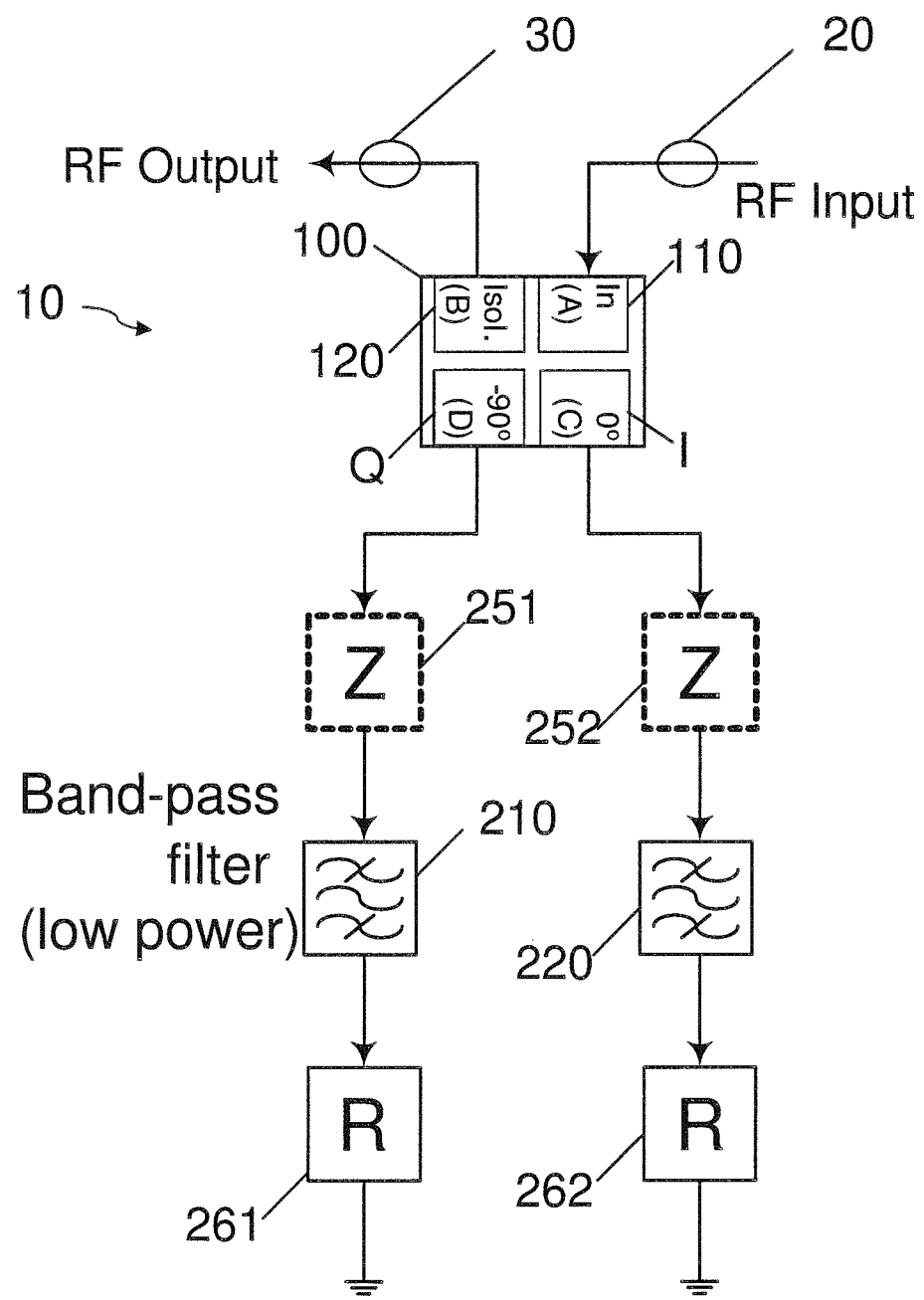
FIG. 2 shows a filtering device according to the present disclosure.

FIG. 2 shows a block diagram of the filtering device 10 of the present disclosure. The filtering device 10 comprises an analogue quadrature splitter 100. The analogue quadrature splitter 100 comprises an RF input 110 to receive an input signal 20. The analogue quadrature splitter 100 is adapted to split the input signal 20 into an in phase component I at one of the quadrature outputs and into a quadrature component Q of the input signal 20 at a second output. It is to be understood that the power comprised within the input signal 20 is equally distributed to the first and second output of the analogue quadrature splitter 100, i.e. into the in phase component I and the quadrature component Q. The analogue quadrature splitter 100 may be based on a stripline, a microstrip, a lumped-element equivalent, a transformer-based hybrid (i.e. a quadrature hybrid), etc.. Other continuous-time (analogue) methods of achieving quadrature may also be applicable. In a typical application of the analogue quadrature splitter 100, the RF output 120 of the analogue quadrature splitter 100 would be terminated by a defined load, for example 50 Ohms. According to the present disclosure the output 120 is not terminated. From the analogue quadrature splitter 100 the in phase component I and the quadrature component Q each reach impedance matching networks. The quadrature component Q reaches a first impedance matching network 251. The in phase component I reaches a second impedance matching network 252. The first impedance matching network 251 and the second impedance matching network 252 are optional and may be required if the filtering elements 210, 220 require the RF signal to be matched to an appropriate load. An additional impedance matching network (not shown) may also be provided between the first filtering element 210 and the first load 261. Likewise, another additional impedance matching network (not shown) may be provided between the second filtering element 220 and the second load 262. The additional impedance matching network and the further additional impedance matching network may be required to match the outputs of the filtering elements 210, 220 to their respective loads 261 and 262.

It is to be understood that the analogue quadrature splitter 100 provides a high level of isolation between the in phase component I and the quadrature component Q. The isolation between the in phase component I and the out of phase component Q may, for example, be in the range of −30 dB or more. The analogue quadrature splitter 100 may be fabricated in strip line technology. It is convenient to implement the analogue quadrature splitter 100 in strip line technology if the input signal 20 is of a power level of several watts up to several tens of watts. As mentioned previously, high-performance filtering elements comprising accurate filtering characteristic in this power range would be expensive and rather bulky. According to the present disclosure the use of the analogue quadrature splitter 100 allows using a first filtering element 210 and a second filtering element 220 being designed for a lower power level. The lower power level is typically in the range of a few hundred milliwatts up to one watt.

The filtering device 10 according to the present disclosure comprises the low-power first filtering element 210 and the low-power second filtering element 220. An RF signal within a first pass band 211p of the first filtering element 210 is terminated in a first load 261. Likewise the RF signal within a second pass band 222p is forwarded into the second load 262. A substantial portion of the RF signal in a first stop band 211s is rejected at the first filtering element 210 and reflected back into the analogue quadrature splitter 100. There could be more than one first stop band 211s within the filtering characteristics of the first filtering element 210. The RF signals within a second stop band 222s of the second filtering element 220 are not being forwarded to the load 262 but reflected back into the in phase input of the analogue quadrature splitter 100. As mentioned previously, the second filtering element 220 may also comprise more than one of the second stop bands 220s. Signal components reflected back to the analogue quadrature splitter 100 from the first filtering element 210 and/or the second filtering element 220 will be shaped according to an effective filtering characteristic as explained in connection with FIGS. 1b and 1c. Effectively a first stop band 211s within the first filtering element 210 will be transformed into at least one effective pass band 300p. The previous pass band of the low-power filters of the first filtering element 210 and/or the second filtering element 220 will be transformed into effective stop bands 300s. Conversely, the previous pass band within the first and second filtering elements 210, 220 will be transformed into effective stop bands 300s.

The first filtering element 210 and the second filtering element 220 may be implemented as surface acoustic wave filters SAW. The SAW filters comprise a high standard of filtering performance at a trade-off of not withstanding a high power level. Typically the SAW filters can handle powers up to one Watt.

Another aspect of the example of the present disclosure shown in FIG. 2 is that the first filtering element 210 and the second filtering element 220 will not be handling any significant power in their respective pass bands 211p and 222p when the filtering elements 210 and 220 are used at the output of a transmitter or other high power RF SAW emitting relatively little power outside of the wanted transmit band. The first filtering element 210 and/or the second filtering element 220 are only required to handle high voltages when used with the filtering device 10. The resulting band stop filter has the rapid roll-off characteristics of the SAW filters but the power handling of the analogue quadrature splitter 100. Typically the analogue quadrature splitter 100 can take a power of several hundred watts over an indefinite time span, if the analogue quadrature splitter 100 is strip-line based. If the first filtering element 210 and/or the second filtering element 220 were implemented as a SAW filter, they would not be able to handle such a power level. It is possible to use the filtering device 10 to transform the first filtering element 210 and the second filtering element 220 from a low-power, high-accuracy filter into a high-power, high-accuracy filter.

With the advent of mobile communication systems SAW filters are widely available and are very economic in price. SAW filters are available prefabricated. For example, several ones of the SAW filtering elements can be implemented on the same substrate or in the same package. The filtering characteristics of a filtering element may be temperature dependent. A change in temperature may therefore translate into a change in response, i.e. a change in transfer function S depending on the temperature. The transformation from the stop bands 211s into the pass bands 211p may deteriorate or shift in frequency upon the change in temperature. The change in temperature may therefore translate into a change in the transfer function S, which is a change in the stop band 211s and/or the pass band 211p. The first filter element 210 and the second filtering element 220 usually have substantially identical filtering characteristics, such that further the response of their filtering characteristics to the temperature changes is substantially identical.

Figure 1F:
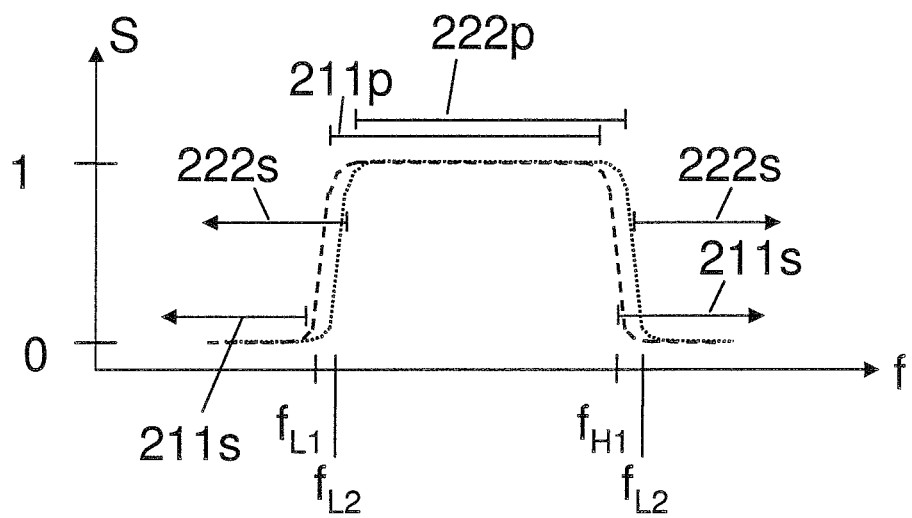
FIG. 1f shows a transformation of two different filtering characteristics into an effective filtering characteristic.
Figure 1F:
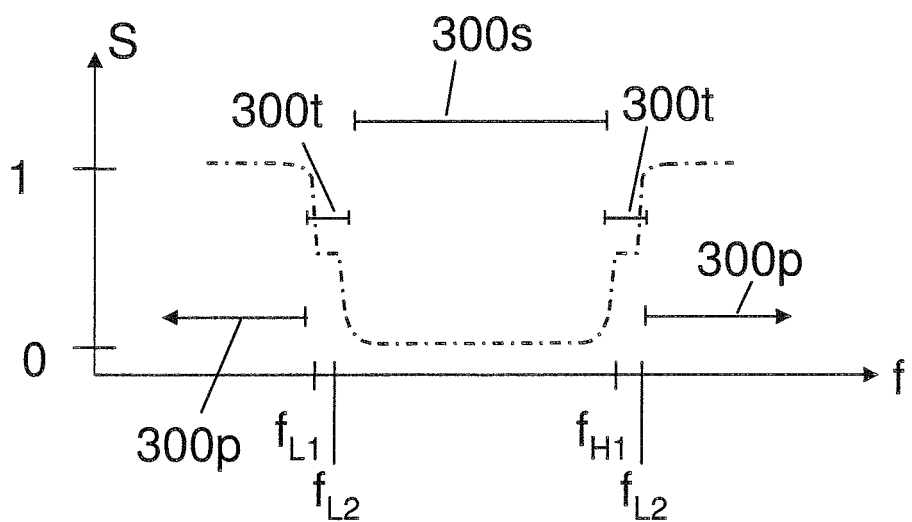

In FIG. 1f a use of the first filtering element 210 and the second filtering element 220 (see FIG. 2) is depicted. The first filtering element 210 has a first filtering characteristic which is slightly different from the second filtering characteristic of the second filtering element 220. As was mentioned previously it is of interest to use a first filtering element 210 and a second filtering element 220 which have substantially identical filtering characteristics. FIG. 1f illustrates how filtering capabilities of the duplexer 1 incorporating the analogue quadrature splitter 100 become deteriorated when using the first filtering element 210 and the second filtering element 220 comprising slightly different filtering characteristics. FIG. 1f shows a first band pass from a first low frequency $f_{L1}$ up to a first high frequency $f_{H1}$ drawn in dashed line. FIG. 1f also shows a second band pass from a second lower frequency $f_{L2}$ to a second high frequency $f_{H2}$ drawn in dotted line. If the filtering characteristics, as depicted in the upper half of FIG. 1f, were used in connection with the analogue quadrature splitter 100 according to the present disclosure, a general filtering characteristic present within the output signal 30 would be deteriorated. This can be seen in the lower half of FIG. 1f. Instead of a steep transition between the effective pass band 300p and the effective stop band 300s a transition band 300t can be observed. The transition band 300t extends between the first low frequency $f_{L1}$ and the second low frequency $f_{L2}$, as well as between the first high frequency $f_{H1}$ and the second high frequency $f_{H2}$. In other words, the transition band 300t represents the portion(s) of the frequency domain in which the first filtering characteristic differs from the second filtering characteristic. In the transition band 300t the effective filter characteristic shows a medium attenuation. It will therefore be appreciated from FIG. 1f why it is of interest for the present disclosure to provide the first filtering element 210 and the second filtering element 220 of substantially identical filtering characteristics.

The first filtering characteristic of the first filtering element 210 may exhibit a temperature dependency. Likewise, the second filtering characteristic of the second filtering element 220 may exhibit a temperature dependency, too. The temperature dependencies of the filtering elements 210 and 220 might not be much of a problem when considered independently because care can be taken that an effect of the temperature dependency remains within reasonable limits. However, as explained above, an excessive discrepancy between the first filtering characteristic and the second filtering characteristic may adversely affect the filtering capabilities of the duplexer 1 when the temperature varies. These adverse effects may be reduced or avoided if the first filtering element 210 and the second filtering element 220 comprise a substantially identical response to temperature changes. The substantially identical response to temperature changes may be achieved if the first filtering element 210 and the second filtering element 220 are technologically similar, for example manufactured by means of the same technology and/or arranged on the same substrate. Another point to consider is that the first filtering element 210 and the second filtering element 220 should be exposed to the same temperature. This may be achieved by arranging the first filtering element and the second filtering element in close proximity to one other.

Figure 3:
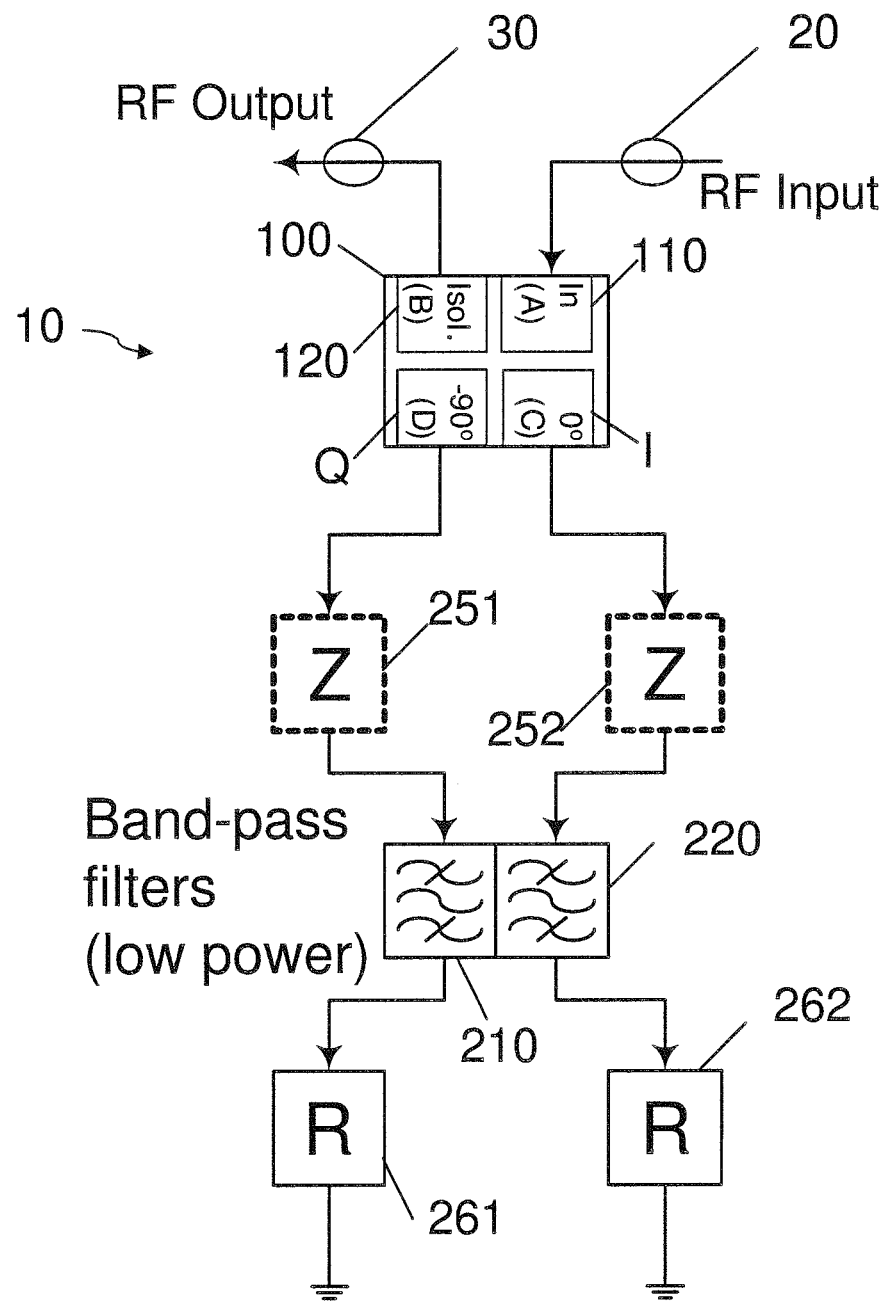
FIG. 3 shows a filtering device with first and second filtering elements disposed on the same substrate or the same package.

FIG. 3 shows an aspect of the filtering device 10, wherein the first filtering element 210 and the second filtering element 220 are provided on the same substrate and/or in an identical package. Therefore the temperature tracking of the first filtering element 210 and the second filtering element 220 will be substantially identical.

Figure 4:
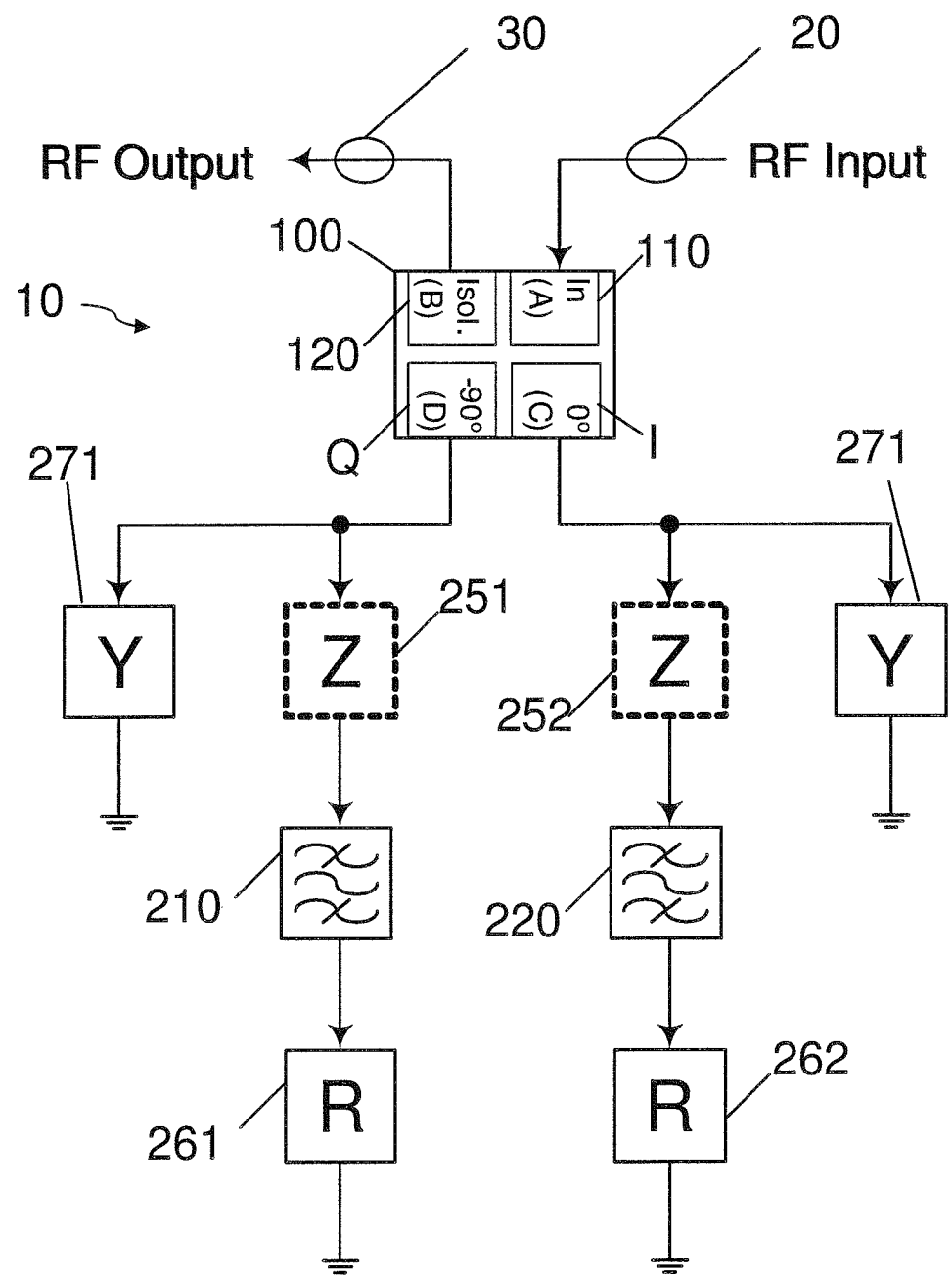
FIG. 4 shows the filtering device according to the present disclosure incorporating auxiliary matching networks.

FIG. 4 shows an example of the filtering device 10 according to the present disclosure. In FIG. 4 there are auxiliary impedance matching networks 271 present for each one of the in phase component I and the quadrature component Q, different to the aspects of the filtering element 10 as disclosed previously. The auxiliary matching networks 271 help improving the filtering characteristics of the first filtering element 210 and the second filtering element 220 within the effective filtering characteristics 300. The effective filtering characteristic is present within the output signal 30 of the filtering device 10. The output signal 30 is yielded in response to the input signal 20 present at the input 110 of the analogue quadrature splitter 100. The auxiliary matching networks 271 are to improve the filtering characteristics within a stop band 211s of the first filtering characteristics and/or a stop band 222 as of the second filtering characteristics of the second filtering element 220. In a region of transition from a pass band 210p, 220p into a stop band 210s, 220s group-delay and/or phase characteristics are typically poor for prior art high-performance, low-power filters. Likewise the group delay and/or phase characteristics are typically poor within the stop bands 210s, 220s of the high-performance, low-power filters, such as SAW filtering elements. One finds extreme variations of the group delay and/or the phase characteristics within regions of transition and the stop band regions 210s, 220s. The stop bands 211s and/or 222s are transformed into effective pass bands 300p by the analogue quadrature splitter 100 present in the output signal 30. Therefore it is of interest to smooth phase and/or group-delay characteristics within regions of transition and/or the stop bands 210s, 220s of the first filtering element 210 and/or the second filtering element 220. If the region of transition and the stop bands 210s of the first filtering element 210 and/or the second filtering element 220 are kept smooth with respect to phase and/or group delay; the phase and/or the group delay will appear smooth within the general filtering characteristics 300. It may be of interest to provide the auxiliary matching networks 271 that exhibit a lower impedance than the stop bands 211s of the first filtering element 210 and/or the stop band 222s of the second filtering element 220. Typically an impedance of the auxiliary matching networks 271 dominates a stop band impedance of the first filtering element and the second filtering element 210, 220. As a result well behaved group delay and/or phase characteristics of the auxiliary impedance 271 will dominate the group delay and/or phase characteristics of the effective pass band 300p of the filtering device 10.

Figure 5:
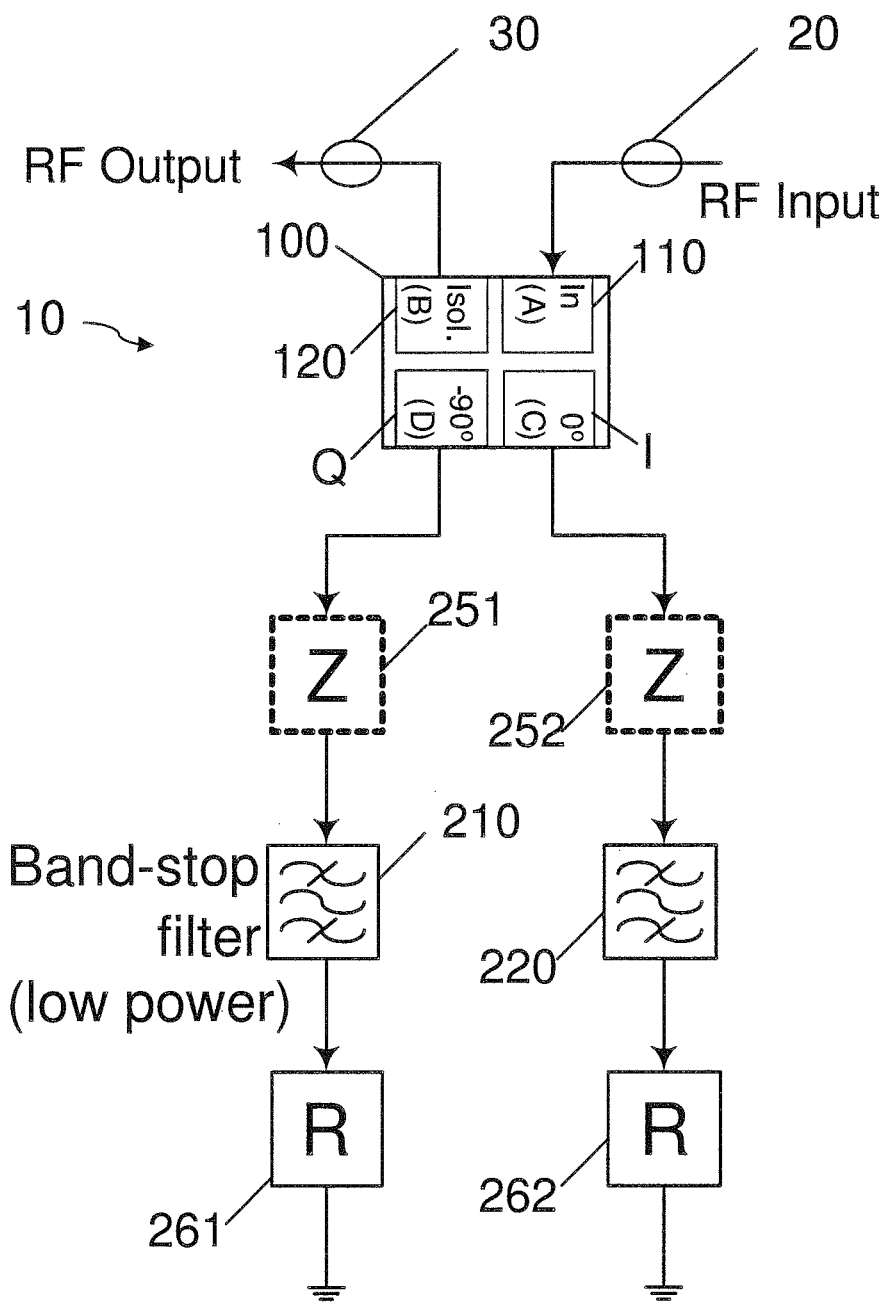
FIG. 5 shows a further example of the filtering device.

FIG. 5 shows an example of the filtering device 10 in which the first filtering element 210 and the second filtering element 220 are implemented as a band stop filter. The band stop filter is transformed into a band pass filter according to the present disclosure, as can be seen from FIGS. 1d and 1e.

Figure 6:
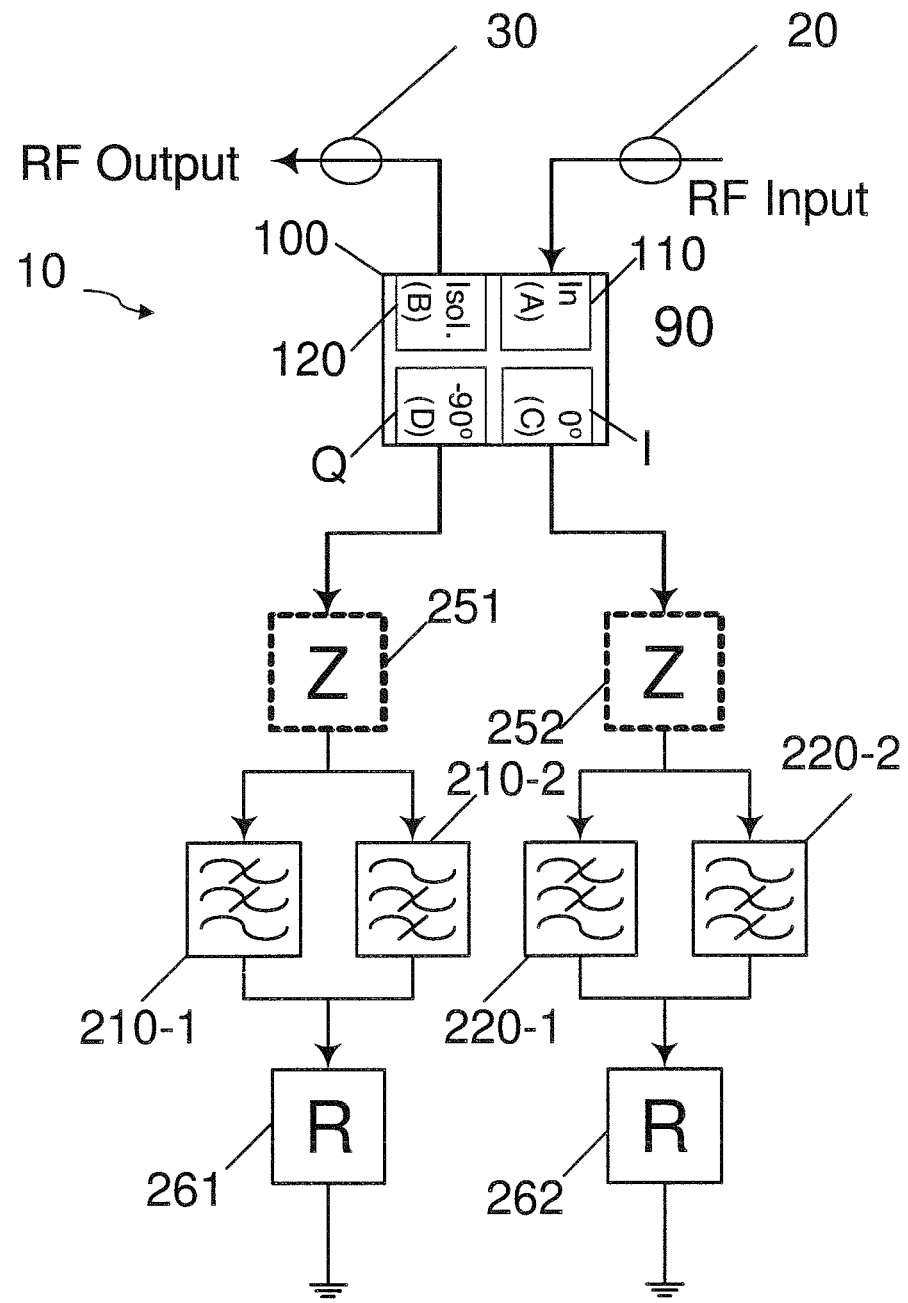
FIG. 6 shows an example of the filtering device with first and second filtering element comprising combined low pass and high pass filters.

FIG. 6 shows another example of the filtering device 10. Within FIG. 6 the first filtering element 210 (see for example FIG. 2) has been split into a first component 210-1 of the first filtering element 210 and a second component 210-2 of the first filtering element 210. Likewise the second filtering element 220 has been split into a first component 220-1 and a second component 220-2 of the second filtering element 220.

Let us consider the first filtering element 210 first. The use of the first component 210-1 and the second component 210-2 of the first filtering element 210 may be of interest in order to form a broad filtering characteristic spanning pass bands/and or stop bands over relatively wide frequency ranges. It is known in the art to form broad filtering characteristics by implementing a combination of the first component 210-1 and the second component 210-2 of the first filtering element 210. Likewise, using the first component 220-1 and the second component 220-2 of the second filtering element 210 allows implementing very broad filtering characteristics. Using the first components 210-1, 220-1 and the second components 210-2, 220-2 allows forming of a band pass or a band stop. Which of a band pass or a band stop characteristic is formed, depends upon the roll-off of the first component 210-1 of the first filtering element 210 and the second component 210-2 of the first filtering element 210, as is known in the art. It is possible to set up a band pass filter and/or a band stop filter by selecting low pass filtering elements and high pass filtering elements accordingly. The setup of the band pass filter and/or the stop pass filter depends on the roll-off of each one of the first component 220-1 and the second component 220-2. The filtering characteristic (such as the roll-off and pass-band responses) of the first filtering element 210-1, 210-2 and the second filtering element 220-1, 220-2 should be substantially identical in order to provide a good effective filtering characteristic 300 being present within the output signal 30. All remaining features of FIG. 6 have been discussed previously and are referred to by using identical reference numbers.

Figure 7A:
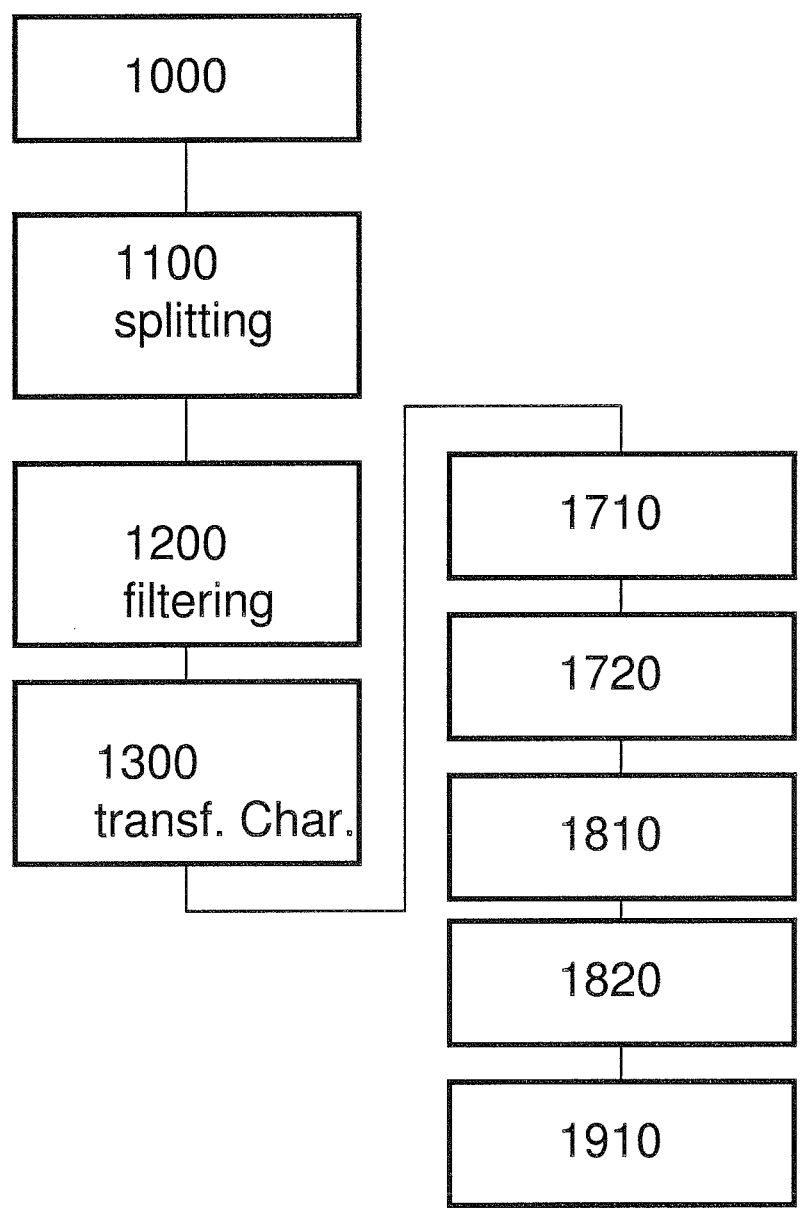
FIG. 7a shows a diagram of a method of filtering.

In FIG. 7a a diagram of a method 1000 for filtering is illustrated. The method 1000 comprises a step 1100 in which an input signal 20 is split into an in phase component I and a quadrature component Q. In a step 1200 at least one of the in phase component I and the quadrature component Q are being filtered. In a step 1300 the filtering characteristics are being transformed. A stop band is substantially transformed into a pass band. A pass band is substantially transformed into a stop band. As mentioned before, it is of interest to provide pass bands and stop bands 211s, 211p of the first filtering element 210 substantially identical with the first stop band 220s and the first pass band 220p of the second filtering element 220 in order to improve the transformed filtering characteristics comprising the effective stop bands 300s and the effective pass bands 300p. As mentioned previously, the step of transforming 1300 may add additional ripple to the transformed filtering characteristics. The transformed filtering characteristics comprise the effective stop bands 300s and the effective pass bands 300p present in the output signal 30. In a step 1710 the in phase component I is impedance matched. In a step 1720 the quadrature component Q is impedance matched.

In a step 1810 the in phase component I is terminated within the pass band 220p, for example using the second filtering element 220. In a step 1820 the quadrature component Q is being terminated within the pass band 210p. In a step 1910 an attenuation in the stop band 211s of the first filtering element and/or the stop band 222s of the second filtering element is increased, whereby a smoothness, with respect to phase and/or group-delay, is increased for the effective pass band 300s. The step 1910 may be implemented using the auxiliary matching networks 271.

Figure 7B:
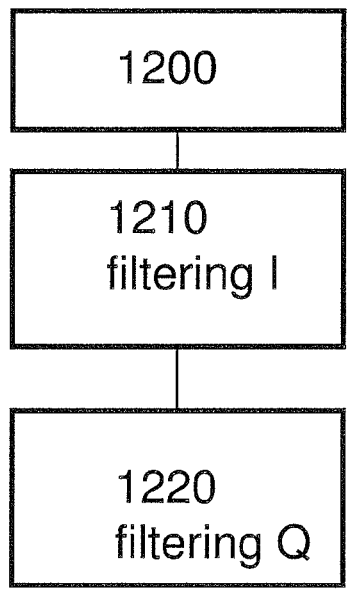
FIG. 7b shows details of a step of filtering.

FIG. 7b shows details of the step of filtering 1200. The step of filtering 1200 comprises a filtering 1210 of the in phase component I according to a first pass band 211p and a first stop band 211s. There may be more than one stop band 210s and/or more than one pass band 210p within the filtering step 1210 of the in phase component I. A step 1220 comprises filtering the quadrature component Q according to a second pass band 222p and/or a second stop band 222s. There may be more than only one pass band 222p and more than only one second stop band 222s.

Figure 7C:
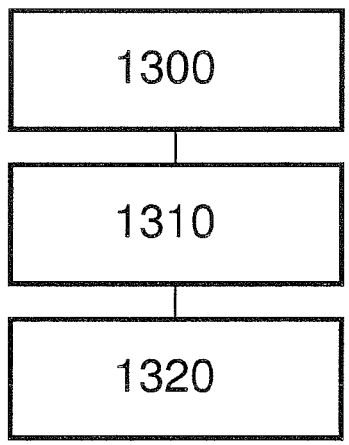
FIG. 7c shows details of the step of transforming filtering characteristics.

FIG. 7c shows details of the step 1300 of transforming the filtering characteristics. The step of transforming 1300 comprises a step of transforming 1310 at least one of the first pass band 211p and a second pass band 222p substantially into at least one effective stop band 300s. It is to be understood that each one of the first pass band 211p and the second pass bands 220p may be translated into the effective stop band 300s. It is possible that not all of the pass bands 211p and/or 220p are translated into the effective stop band 300s, for example due to additional ripple deteriorating the transforming of the pass bands 210p, 220p. A step 1320 comprises a transforming of at least one of the first stop band 211s or the second stop band 222 substantially into at least one effective pass band 300p. Each one of the first stop bands 211s and the second stop bands 220p may be transformed into the effective pass band 300p. It is possible that not all of the stop bands 211s and/or 220s are translated into the effective pass band 300p, for example due to additional ripple deteriorating the transforming of the pass bands 210p, 220p.

Methods for reducing the additional ripple have been disclosed previously. Therefore the present disclosure transforms high-performance filtering properties of a low-cost, low-power filtering element into low-cost, high-power filtering elements while substantially maintaining the high accuracy of the low-power filtering element at high RF powers.

The present disclosure further provides a computer programme product comprising executable instructions for a processor, enabling the processor to carry out a manufacture of the filtering device 10.

Further more the present disclosure provides a computer programme product comprising executable instructions for a processor, enabling the processor to carry out the method of filtering 1000 of the present disclosure.

It will be appreciated by a person skilled in the art that all those aspects of the disclosure described herein as an apparatus may at least partly be incorporated as software. The methods as described herein may without limitation be implemented as a computer program and/or a dedicated hardware to carry out the method. Changing from a method to a computer program and/or a dedicated piece of hardware does not depart from the spirit of the disclosure.

While various embodiments of the present disclosure have been described above, it should be understood that they have been presented by way of example, and not limitation. It will be apparent to persons skilled in the relevant arts that various changes in form and detail can be made therein without departing from the scope of the disclosure. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present disclosure may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present disclosure should not be limited by any of the above-described exemplary embodiments, but should be defined only in accordance with the following claims and their equivalents.

The invention claimed is:

1. A filtering device comprising:
   An analogue quadrature splitter for splitting an input signal into an in phase component and a quadrature component;

a first filtering element with a first filtering characteristic comprising at least one first pass band and at least one first stop band;

a second filtering element with a second filtering characteristic comprising at least a second pass band and at least a second stop band;

wherein the analogue quadrature splitter is adapted to substantially transform at least one of the at least one first pass band or the at least one second pass band into at least one effective stop band;

wherein the analogue quadrature splitter is adapted to substantially transform at least one of the at least one first stop band or the at least one second stop band into at least one effective pass band; and further comprising at least one auxiliary termination network adapted to increase an attenuation in the at least one effective stop band.

2. The filtering device according to claim 1, wherein at least one of the first filtering element or the second filtering element is adapted to filter signals at a first power level; and wherein at least one of the at least one effective stop band or the at least one effective pass band are adapted to filter signals at a second power level at the entry of the analogue quadrature splitter; wherein the second power level is substantially higher than the first power level; and wherein the analogue quadrature splitter is operable at the second power level.

3. The filtering device according to claim 1, wherein the analogue quadrature splitter is adapted to substantially transform at least one of the first filtering characteristic comprising a first band pass or the second filtering characteristic comprising a second band pass into at least one effective band stop.

4. The filtering device according to claim 1, wherein the analogue quadrature splitter is adapted to substantially transform at least one of the first filtering characteristic comprising a first band stop or the second filtering characteristic comprising a second band stop into at least one effective band pass.

5. The filtering device according to claim 1, wherein the first filtering characteristic and the second filtering characteristic are substantially identical.

6. The filtering device according to claim 1, wherein the first filtering element and the second filtering element comprise a substantially identical response to temperature changes.

7. The filtering device according to claim 1, further comprising
a first impedance matching network coupled to the first filtering element;
a second impedance matching network coupled to the second filtering element.

8. The filtering device according to claim 1, further comprising:
a first load for terminating the in phase component; and
a second load for terminating the quadrature component.

9. The filtering device according to claim 1, wherein at least one of the first filtering element or the second filtering element is a surface acoustic wave (SAW) filtering element.

10. The filtering device according to claim 1, wherein the analogue quadrature splitter is implemented in strip line technology.

11. A method for filtering an input signal, the method comprising the steps of:
splitting the input signal into an in phase component and a quadrature component by means of analogue processing;

filtering the in phase component according to at least one first pass band and at least one first stop band;

filtering the quadrature component according to at least one second pass band and at least one second stop band;

transforming at least one of the at least one first pass band or the at least one second pass band substantially into at least one effective stop band, transforming at least one of the at least one first stop band or the at least one second stop band substantially into at least one effective pass band wherein the transformed filtering characteristics generate an output signal substantially comprising the transformed filtering characteristics; and increasing an attenuation in the at least one effective stop band.

12. The method according to claim 11, the method further comprising:
impedance matching the in phase component; and
impedance matching the quadrature component.

13. The method according to claim 11, further comprising:
terminating the in phase component; and
terminating the quadrature component.

14. The method according to claim 11, wherein the filtering of the in phase component and the filtering of the quadrature component comprise using a substantially identical filtering characteristic.

15. The method according to claim 11, wherein the filtering of the in phase component and the filtering of the quadrature component comprise a substantially identical response to temperature changes.

16. The method according to claim 11, wherein the filtering of the in phase component and the filtering of the quadrature component is implemented using filtering elements operable at a first power level.

17. The method according to claim 16, wherein at least one of the at least one effective pass band or the at least one effective stop band is adapted to substantially filter signals at a second power level, the second power level being substantially higher than the first power level.

18. Computer program product embodied on a non-transitory computer-readable medium and the non-transitory computer-readable medium comprising executable instructions for the execution of a manufacture of a filtering device comprising:
a analogue quadrature splitter for splitting an input signal into an in phase component and a quadrature component;

a first filtering element with a first filtering characteristic comprising at least a first pass band and at least a first stop band;

a second filtering element with a second filtering characteristic comprising at least a second pass band and at least a second stop band;

wherein the analogue quadrature splitter is adapted to substantially transform at least one of the at least one first pass band or the at least one second pass band into at least one effective stop band; and wherein the analogue quadrature splitter is adapted to substantially transform at least one of the at least one first stop band or the at least one second stop band into at least one effective pass band;

yielding an output signal comprising the at least one effective stop band and the at least one effective pass band.

19. Computer program product embodied on a non-transitory computer-readable medium and the non-transitory computer-readable medium comprising executable instructions for the execution of a method of a filtering, the method comprising:
- splitting an input signal into an in phase component and a quadrature component;
- filtering at least one of the in phase component and the quadrature component;
- transforming filtering characteristics;
- wherein the transformed filtering characteristics yield an output signal comprising the transformed filtering characteristics.

* * * * *